United States Patent
Yokogawa et al.

(10) Patent No.: US 6,629,538 B2
(45) Date of Patent: Oct. 7, 2003

(54) METHOD FOR CLEANING SEMICONDUCTOR WAFERS IN A VACUUM ENVIRONMENT

(75) Inventors: Kenetsu Yokogawa, Tsurugashima (JP); Yoshinori Momonoi, Kokubunji (JP); Masaru Izawa, Hino (JP); Shinichi Tachi, Sayama (JP)

(73) Assignee: Hitachi, Ltd., Tokyo (JP)

( * ) Notice: Subject to any disclaimer, the term of this patent is extended or adjusted under 35 U.S.C. 154(b) by 137 days.

(21) Appl. No.: 09/811,652

(22) Filed: Mar. 20, 2001

(65) Prior Publication Data

US 2002/0092541 A1 Jul. 18, 2002

(30) Foreign Application Priority Data

Jan. 16, 2001 (JP) ........................................ 2001-007156

(51) Int. Cl.[7] ................................................ B08B 6/00
(52) U.S. Cl. ................................ 134/1.2; 134/2; 134/6; 134/21; 134/32; 134/33; 134/34; 15/1; 15/38; 15/102
(58) Field of Search ........................... 134/1.2, 2, 6, 21, 134/32, 33, 34, 119, 198; 15/1, 38, 102

(56) References Cited

U.S. PATENT DOCUMENTS 5,624,501 A * 4/1997 Gill, Jr. ............................ 134/6

2002/0005212 A1 * 1/2002 Beardsley et al. ............. 134/6
2002/0092121 A1 * 7/2002 Momonoi et al. ............. 15/345

FOREIGN PATENT DOCUMENTS

| JP | 8-85887 | 4/1996 |
|----|---------|--------|
| JP | 8-131981 | 5/1996 |
| JP | 9-17776 | 1/1997 |
| JP | 9-321031 | 12/1997 |

* cited by examiner

Primary Examiner—Randy Gulakowski
Assistant Examiner—Gentle E. Winter
(74) Attorney, Agent, or Firm—Mattingly, Stanger & Malur, P.C.

(57) ABSTRACT

A method of dry cleaning surfaces of a semiconductor wafer includes the steps of placing a processed wafer in a vacuum environment and positioning a pad near each of a front surface and a back surface of the wafer. Cleaning gas is injected into a small clearance formed between each pad and the front and rear surfaces to generate a high-speed gas flow along the surface of the wafer. Particles left at the surfaces of the processed wafer are physically cleaned and removed with the high-speed gas flow. In order to assist this physical cleaning action, it is also possible to apply either a chemical cleaning method or an electrical cleaning method under application of plasma.

18 Claims, 10 Drawing Sheets

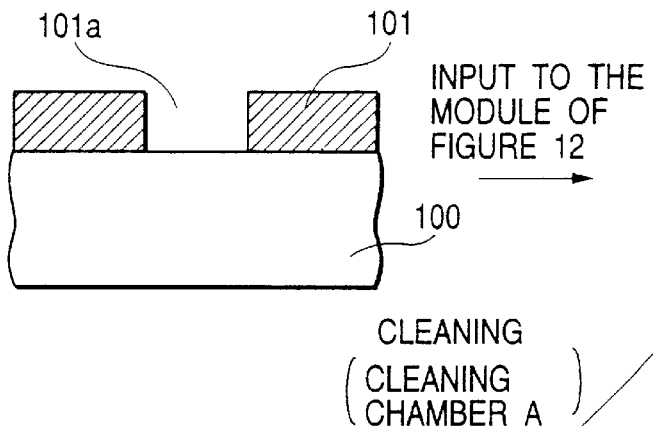
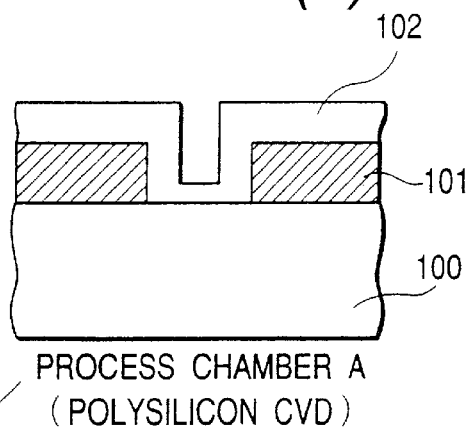
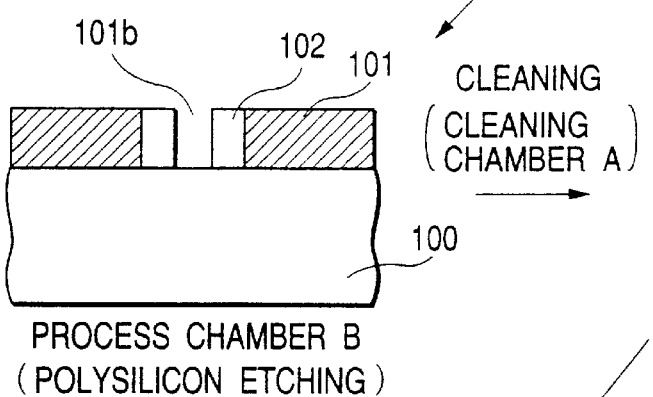
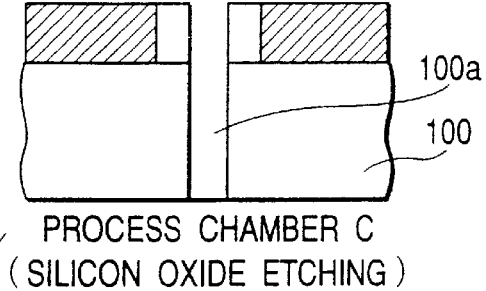
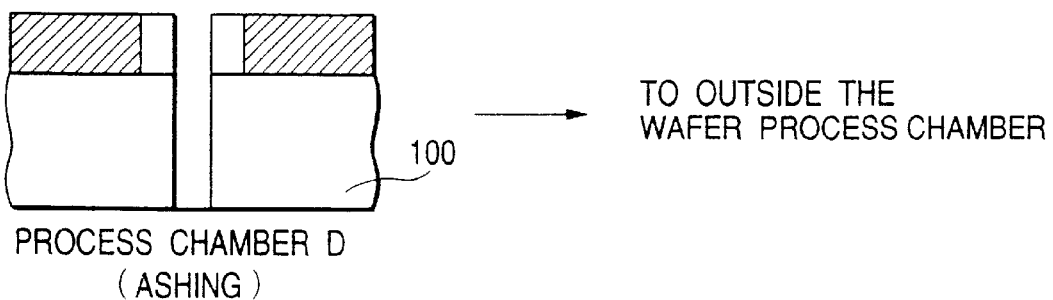

FABRICATION OF DEVICE ISOLATION REGION AND DEPOSITION OF POLYSILICON

FABRICATION OF GATE ELECTRODE (POLYSILICON ETCHING)

FABRICATION OF EXTENSION

DEPOSITION OF NITRIDE FILM

FABRICATION OF GATE SIDE WALL FILM

FABRICATION OF SILISIDE

METHOD FOR CLEANING SEMICONDUCTOR WAFERS IN A VACUUM ENVIRONMENT

BACKGROUND OF THE INVENTION

1. Field of the Invention

This invention relates to a wafer cleaning method in a manufacturing stage for a semiconductor device, and more particularly a technology for removing particles left on the wafer surface within a vacuum environment after processing with plasma or after flattening with plasma at a pre-stage of the semiconductor manufacturing process.

2. Description of the Related Prior Art

In the prior art cleaning for a semiconductor wafer (hereinafter abbreviated as a wafer), the cleaning operation is carried out such that either pure water or a solution diluted with various kinds of acids or an alkaline solution is applied. The wafer is immersed in the solution or the solution is blown against the wafer to wash away particles at the surface of the wafer. In addition, a method for mechanically cleaning the wafer surface with a brush concurrently with immersion of wafer in the solution or the like is also used.

The aforesaid cleaning method of the prior art shows the following problems due to the fact that this is a so-called wet cleaning method in which basically water is used for cleaning operation.

1) Although a continuous total processing within a vacuum environment such as a dry etching or a plasma CVD or the like increases a machining precision or manufacturing efficiency, cleaning operation required after each of the processings is a wet type processing, so that it generates a necessity for once putting out the wafer into atmosphere and thus the aforesaid effects may not be attained.

2) The wet cleaning operation requires a rinsing stage and a drying stage in addition to the cleaning operation, resulting in that the number of manufacturing stages is increased.

3) In the case of wet cleaning operation, the pole surface of the semiconductor material is degraded in its quality and as the size of a semiconductor device is made small, its yield is reduced by the degraded material quality at the surface.

4) In the case of performing the wet cleaning operation, liquid is not sufficiently immersed on the small structural part of the semiconductor device sometimes due to a surface tension of liquid and suitable cleaning power with respect to the small structural part is insufficient.

5) A high performance device has required high wet-absorbing material such as organic film or porous organic film as a new material for a semiconductor device, and, in particular, an insulating film material as a new material in the future. In the case of manufacturing the semiconductor device using these new materials, either the wet cleaning or a mere occasional exposure in the surrounding atmosphere causes a characteristic of the device to be deteriorated.

6) A wet cleaning is normally carried out under a batch processing. In the case that the wafer has 300 mmØ (diameter) or more, it takes much time in cleaning of the wafer and handling before and after the cleaning.

In turn, as a cleaning method in place of the aforesaid wet cleaning operation, there is provided a dry cleaning method. As to the dry cleaning method, this method has been disclosed in Japanese Patent Laid-Open Nos. Hei 8-131981, 8-85887 or 9-17776, for example.

SUMMARY OF THE INVENTION

It is an object of the present invention to provide a cleaning method performed in vacuum and a dry cleaning method capable of attaining a cleaning power corresponding to the wet processing even in cleaning within vacuum environment in order to solve the problems accompanied with the aforesaid wet cleaning.

A summary of the disclosed invention that is a representative one of the disclosed inventions will be described in brief as follows.

The dry cleaning method of the present invention is characterized in that the front surface and/or the rear surface of the wafer are cleaned by a method wherein pads or blocks arranged near or in contact with the front surface and the rear surface of the processed wafer within a processing container vacuum evacuated by a vacuum evacuating means and each of the pads is moved relative to the wafer while a gas flow is being supplied between the pads and the wafer.

BRIEF DESCRIPTION OF THE DRAWINGS

FIG. 14(a), FIG. 14(b), FIG. 14(c), FIG. 14(d) and FIG. 14(e) are views for showing a manufacturing process of semiconductor device in accordance with the semiconductor-manufacturing device shown in FIG. 12.

DESCRIPTION OF THE PREFERRED EMBODIMENTS

Figure 1:
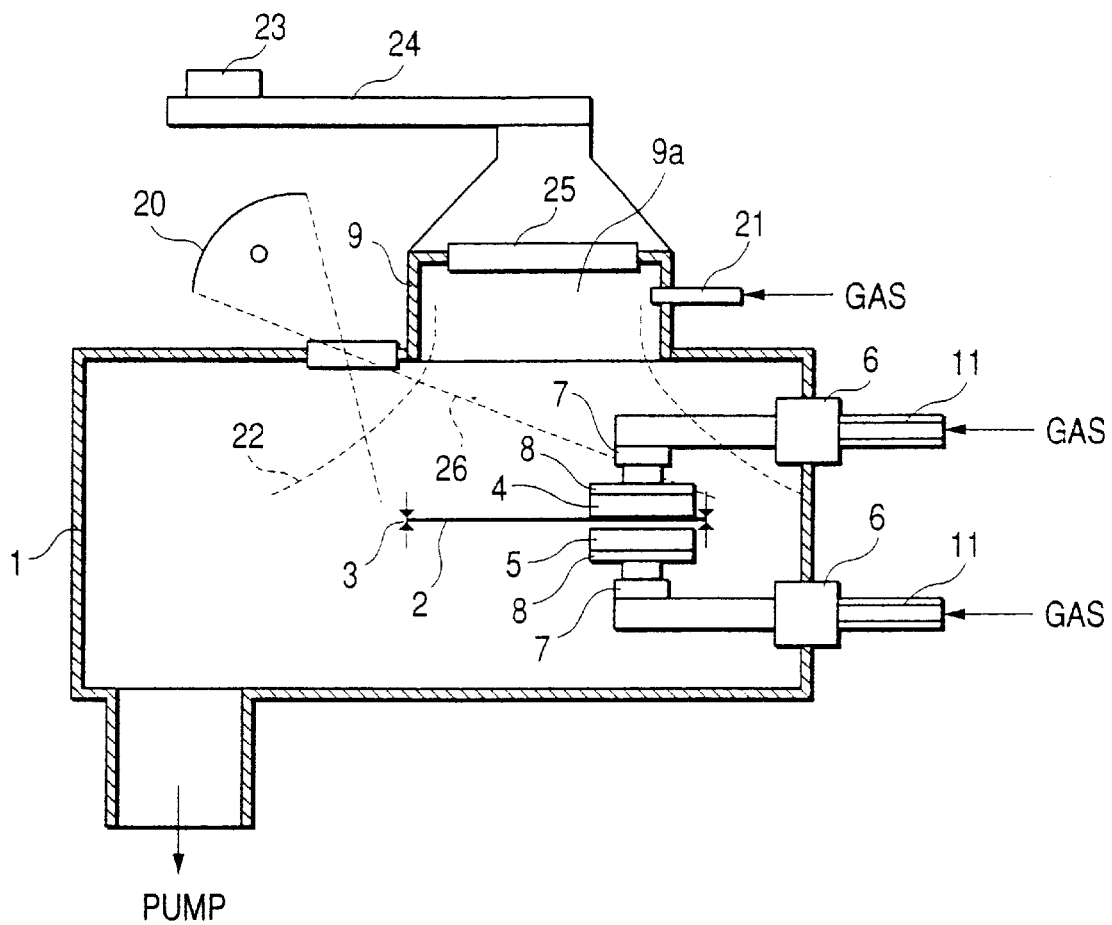
FIG. 1 is a basic configuration view for showing a dry cleaning apparatus of a preferred embodiment 1 of the present invention.

Referring now to the drawings, some preferred embodiments of the present invention will be described in detail as follows.

Preferred Embodiment 1

A first preferred embodiment of the present invention and its operation in a dry cleaning method of the present invention will be described as follows. An object to be washed here is a circular semiconductor wafer with a diameter of about 300 mmØ (diameter) for example.

In FIG. 1 is shown a basic configuration of a dry cleaning apparatus applied for executing a dry cleaning method in accordance with a first preferred embodiment of the present invention. Within a vacuum container 1 having a vacuum evacuating means (a vacuum pump/not shown) are installed a processed wafer 2 and a processed wafer mounting means 3 for mounting the processed wafer 2. The processed wafer mounting means 3 is constituted to support the processed wafer 2 at four points of its peripheral section and has a function to rotate the processed wafer 2 in a circumferential direction by rotating this supporting section. Pads or blocks 4, 5 are arranged near the front or upper surface and the rear or lower surface of the processed wafer 2. The pads 4, 5 are provided with a scanning or moving mechanism 6 enabling them to be moved in a horizontal direction on the processed wafer 2 and a wafer elevation mechanism 7 arranged near the processed wafer 2. Weight sensor means 8 for sensing an applied load acting between the pads 4, 5 and the processed wafer 2, are mounted on the pads 4, 5. Movement of the wafer elevation mechanism 7 is controlled by the weight applied between the pads 4, 5 and the processed wafer 2 so as to control a clearance between the pads 4, 5 and the processed wafer 2. A plasma generating means 9 is mounted at the upper part of the vacuum container 1. In the preferred embodiment, a plasma generating means using an electromagnetic wave in a microwave band is used. That is, a microwave oscillation section 23, a wave-guide 24 and a dielectric window 25 constitute the plasma generating means 9. $CF_4$ gas is supplied from a gas-feeding segment 21 to a plasma generating section 9a.

In the preferred embodiment, an electromagnetic wave in the microwave band of 2.45 GHz is applied at the plasma generating means 9. However, either an electromagnetic wave in the UHF band or an electromagnetic wave in a radio-frequency band may be used. Moreover, a similar effect can be attained even if magnetic fields are overlapped on these electromagnetic waves. In brief, whatever type of means capable of generating plasma may be applied, they may have a similar effect.

In the preferred embodiment, the processed wafer 2 is arranged within a diffusion area of plasma 22 generated by the plasma generating means 9. Arranging the processed wafer 2 within the diffusion area enables excessive damage or the like caused by plasma 22 to be prevented from being applied to the processed wafer 2.

As a temperature control means 20 for the processed wafer 2, an infrared ray lamp is installed and a temperature of the processed wafer 2 can be controlled in a range from a room temperature (about 25° C.) to 300° C. under radiation of infrared rays 26 from the lamp. The processed wafer 2 is cooled with a gas flow injected from the pads 4, 5 and an output of the infrared-ray lamp in the temperature control means 20 is controlled in such a way that a temperature of the processed wafer is made constant in compliance with a heating operation performed by the infrared-ray lamp. In the preferred embodiment, although a temperature control means for the aforesaid processed wafer is used, if sufficient cleaning power can be attained without increasing the temperature of the processed wafer, such a temperature control means as above is not necessarily applied.

Figure 2:
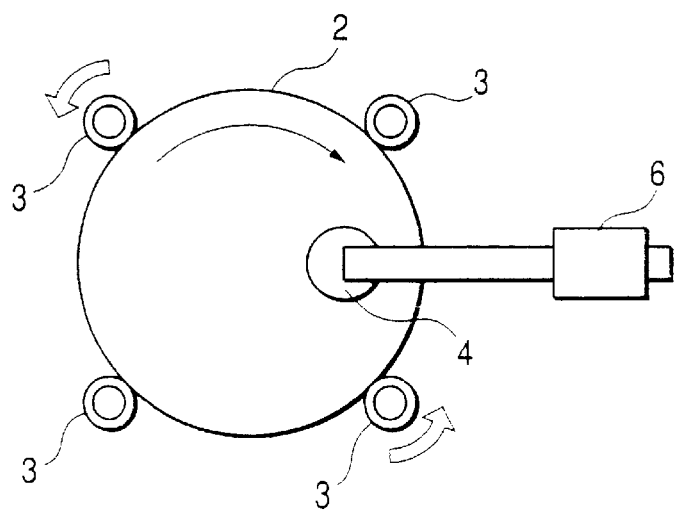
FIG. 2 is an illustrative view for showing one example of configuration of a processed wafer mounting means in a preferred embodiment 1 of the present invention.

FIG. 2 is a top plan view for illustrating a detail of the processed wafer mounting means 3. This figure is a view in which the processed wafer 2 and the processed wafer mounting means 3 are seen from above the processed wafer 2. The outer circumference of the processed wafer 2 is contacted with and held by the four processed wafer mounting means 3. In addition, the processed wafer 2 is rotated by a method wherein each of the processed wafer mounting means 3 is rotated as shown in the figure. Application of the processed wafer mounting means 3 shown in FIGS. 1 and 2 enables both surfaces of the processed wafer 2 to be open, resulting in a simultaneous cleaning of both surfaces.

Figure 3:
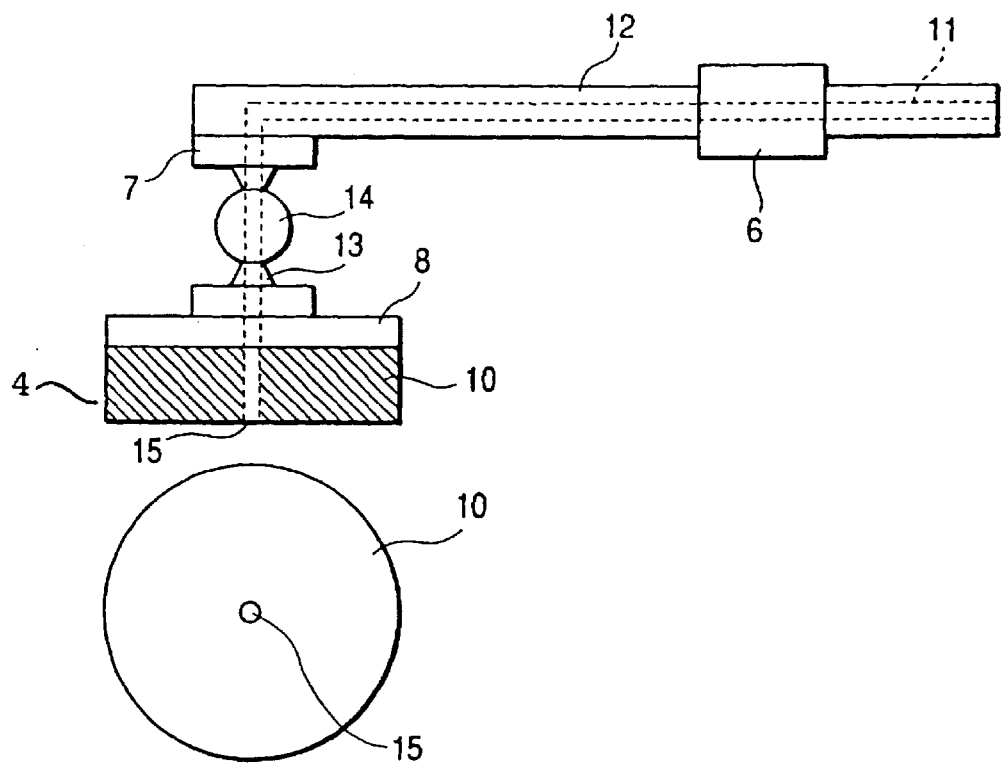
FIG. 3 is a view for showing one example of configuration of a pad in a preferred embodiment 1 of the present invention.

FIG. 3 illustrates a detailed example of a configuration of the pad 4 positioned at front or upper surface side of the processed wafer 2. Although not shown in FIG. 3, the pad 5 is similarly positioned at the rear or lower surface side of the processed wafer 2. The pads 4, 5 arranged near the processed wafer 2 are each constituted by a pad 10 formed of TEFLON material arranged near the processed wafer 2. A gas feeding section 11, a supporting section 12, an applied weight detecting or sensor means 8, a scanning or moving mechanism 6 for the pad 10, and a connecting mechanism 13 for the wafer elevation mechanism 7 are provided for moving the pad 10. The connecting mechanism 13 is constructed such that it has an articulating mechanism capable of controlling a generally parallel state between both surfaces of the processed wafer 2 and the plane of the pad 10 around a fulcrum point 14. This structure is operated such that gas is supplied from the gas feeding section 11 to the upper part of the pad and the gas is injected between the pad 10 and the processed wafer 2.

Figure 4:
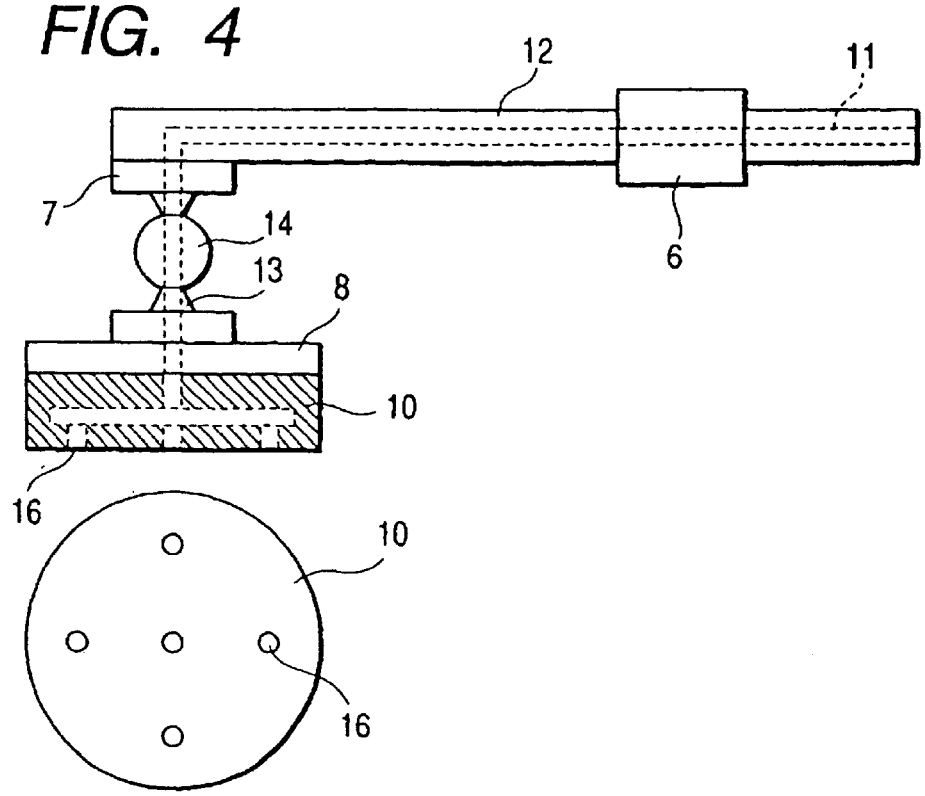
FIG. 4 is a view for showing one example of another configuration of a pad in a preferred embodiment 1 of the present invention.

In the preferred embodiment, as shown in FIG. 3, suitable means such as opening 15 are provided at one central location of the pad 10 for injection gas. In another form gas is injected from a gas injection part having a plurality of gas injection holes 16 equally arranged within a plane of the pad 10 as shown in FIG. 4.

Figure 5:
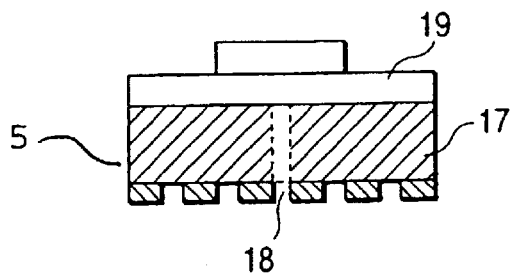
FIG. 5 is a view for showing one example of configuration of a pad for cleaning the rear surface in a preferred embodiment 1 of the present invention.
Figure 6:
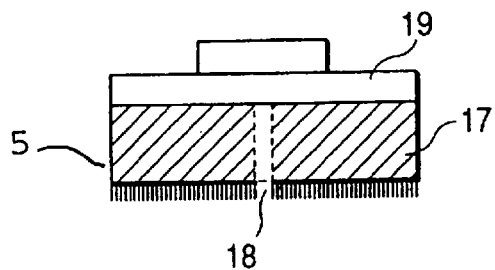
FIG. 6 is a view for showing one example of another configuration of a pad for cleaning the rear surface in a preferred embodiment 1 of the present invention.

FIGS. 5 and 6 illustrate the configuration of the pad 5 near the rear surface of the processed wafer 2. The rear surface of the processed wafer where a semiconductor device (for example, MISFET and the like) is not formed is scarcely influenced by mechanical damage. Thus, in the preferred embodiment shown in FIGS. 5 and 6, in order to achieve a suitable cleaning power for the rear surface of the processed wafer, the pad and the rear surface of the processed wafer are not set in a non-contacted state as found in the pad shown in the previous FIGS. 3 and 4, but rather the pad is directly contacted with the rear surface of the processed wafer. As shown in FIGS. 5 and 6, respectively, the surface of the pad 17 contacted with the processed wafer is of a corrugated shape or a brush-like form. Also in the embodiment shown in FIGS. 5 and 6, there is provided a structure in which gas is injected from a gas injection port 18 in order to prevent some particles removed once from the rear surface of the wafer under a particle removing action with the pad 17 from being adhered again to the wafer. There also provided a weight detecting means 19 for controlling a contact pressure of the pad 17 against the rear surface of the processed wafer.

In the preferred embodiment, although TEFLON material is used for the pads 4, 5, it is apparent that a similar effect to that described above can be attained even if polyvinyl alcohol, DELRIN, BESPEL, KAPTON, polyvinyl chloride, polyester, silicon oxide, silicon, and aluminum oxide and the like are applied. Basically, it is desirable that, as the material of the pad sections, a more soft material than that at the surface of the wafer 2 is applied. That is, material having a lower hardness than that of the material constituting the processed wafer is applied to the portions of the pads 4, 5 near the processed wafer surface arranged at both front surface and rear surface of the processed wafer 2. In particular, the pads shown in FIGS. 5 and 6 are directly contacted with the rear surface of the processed wafer, so that material such as TEFLON or the like showing a soft characteristic against the processed wafer (a silicon wafer) is the most suitable one. TEFLON is a polymer made from polytetrafluoroetylene (PTFE).

In addition, in embodiment 1, a size of the surfaces of the pads 4, 5 contacted with the processed wafer is of a diameter of 3 cm. A reason why this size is used is that it improves the efficiency of active plasma particles generated by the plasma generating means 9 at the processed wafer 2. That is, if the pad 4 has an excessive size, the surface of the processed wafer is covered by the pad 4 and the active particles from the plasma cannot reach the surface of the wafer. Thus, it is necessary that the size of the pads 4, 5 is smaller than the size of the surface of the processed wafer.

Preferred Embodiment 2

Figure 7:
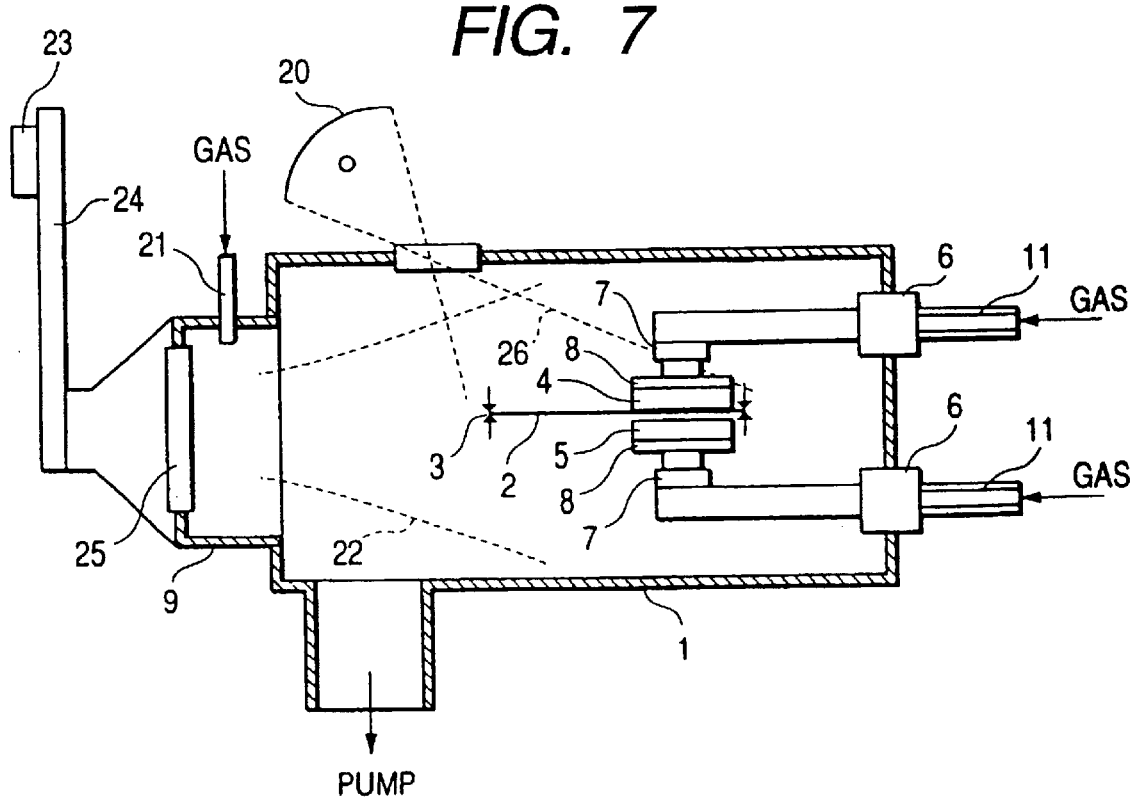
FIG. 7 is a view for showing a basic configuration of a dry cleaning apparatus in a preferred embodiment 2 of the present invention.

In FIG. 7 is shown another example of a dry cleaning apparatus for performing a dry cleaning method of the present invention. The primary difference between the device shown in FIG. 7 and the device shown in FIG. 1 is in the position of the plasma generating means 9. In the preferred embodiment shown in FIG. 1, the plasma generating means 9 is arranged at the front surface side of the processed wafer 2 so that the cleaning effect of the plasma on the front surface of the processed wafer 2 is facilitated.

In the case of the cleaning device shown in FIG. 7, the plasma generating means is arranged at the side surface of the processed wafer 2 so that the plasma cleans both front surface and rear surface of the processed wafer 2. It is also apparent that a similar suitable cleaning effect can be realized on both surfaces of the processed wafer 2 by an arrangement of each of the plasma generating means in opposition to both surfaces of the processed wafer 2. Similarly, it may also be suitable to arrange the plasma generating means at the side surface of the wafer opposite to the plasma generating means 9 shown in FIG. 7. Where it is desired to obtain the cleaning effect of the plasma only against the rear surface of the wafer, it is also apparent that the rear surface of the processed wafer may be arranged at the side of the plasma generating means 9 in the device shown in FIG. 1.

An example of the cleaning step in the preferred embodiment will now be described.

AT first, the processed wafer 2 to be cleaned is supported by the processed wafer mounting means 3. As schematically illustrated in FIG. 1, the processed wafer mounting means 3 holds the edge section of the processed wafer 2 at a plurality of points, and frees both front and rear surfaces of the processed wafer 2 to enable simultaneous cleaning of both front and rear surfaces of the processed wafer 2 to be carried out.

Then, as already described in reference to FIG. 1, the processed wafer 2 is rotated through rotation of the supporting section of the processed wafer mounting section 3. In the case of the preferred embodiment, the rotating speed of the processed wafer 2 is set to 200 rpm. In addition, a temperature of the processed wafer 2 is set to 100° C. by the infrared ray lamp constituting the temperature control mechanism 20. Increasing the temperature of the processed wafer enables a chemical reaction efficiency at the surface of the processed wafer to be increased and the cleaning efficiency may also be increased.

Subsequently, the pads 4, 5 are moved over the upper and lower surfaces of the processed wafer 2 by the scanning mechanism 6 while Ar gas is being injected from each of the gas injection ports 15 of the pads 4, 5. In the preferred embodiment, a flow rate of Ar gas injected from each of the pads 4, 5 may be 20 liters/min. The injected Ar gas is discharged out of the device to the surrounding atmosphere by a discharging means such as a pump connected to the vacuum container 1. Then, a plasma of mixture gas of $CF_4$ fed through a gas feeding means 21 and Ar gas fed by the pads 4, 5 is generated by the plasma generating means 9. After producing the plasma, the pads 4, 5 are moved to the surface of the processed wafer 2 by the wafer elevational mechanisms 7. At this time, a force acting between the pads 4, 5 and the processed wafer 2 is detected by the weight detecting means 8 to control the clearance between the surface of the pads and the processed wafer 2. This creates a high pressure state in the space between the pad surface and the surface of the processed wafer 2 with Ar gas supplied from the pads 4, 5, and applied weight is generated between the pad and the processed wafer 2 even if the pad 5 is not contacted with the processed wafer. Thus the weight and the flow rate of the flowing gas are controlled so as to enable the space between the surface of the pad and the surface of the processed wafer 2 to be controlled.

As the weight detecting means 8, a piezoelectric element, a strain gauge, a spring, a resilient material, a weight or their combination can be used. In the preferred embodiment, it is controlled such that a space between the surface of the pad and the surface of the processed wafer 2 becomes 5 to 20 $\mu$m. However, a suitable effect can also be attained by setting a space between the surface of the pad and he surface of the processed wafer to a range of 1 to 100 $\mu$m. When a space between the surface of the pad 4 and the surface of the processed wafer is set to 1 $\mu$m or less, it becomes difficult to keep the space constant and at the same time if both elements are moved too close to each other, there is a possibility they will contact each other and damage is induced at the surface of the processed wafer 2. Thus, a space of 1 to 100 $\mu$m is the most effective range. The space between the pad 5 for cleaning the rear surface of the processed wafer 2 and the rear surface of the processed wafer does not create any problem at all even if the pad 5 directly contacts the rear surface of the processed wafer due to the fact that it is not needed to repair damage as found in the front surface of the wafer. However, in the case that they are directly contacted with each other, it is necessary to control the applied weight between the pad 5 and the rear surface of the processed wafer 2, and the rear surface is also cleaned with a specified pressing pressure. In addition, where the pad 5 is directly contacted with the rear surface of the processed wafer, the cleaning power can be increased by use of the pads shown in FIGS. 5 and 6.

In the preferred embodiment, although Ar gas is applied as gas supplied from the pads 4, 5, it is also apparent that a similar effect can be realized even if nitrogen, He, Xe and Ne are used. Additionally, in the preferred embodiment, a flow rate of the gas flowing between the pads 4, 5 and the processed wafer 2 is set to 20 liters/min. A similar effect can be attained under a gas flow rate within a range of 0.5 to 500 liters/min. It is natural to say that although the more the flow rate of gas, the higher the cleaning power, only in reference to the cleaning power, 0.5 to 500 liters/min is a practical range in reference to the problem of increased cost caused by the amount of consumption of gas. The pads 4, 5 are operated to scan over the entire surface of the processed wafer 2 by the scanning mechanism 6 as the processed wafer rotates.

In the preferred embodiment, although the processed wafer mounting means 3 for rotating the processed wafer was used, a similar effect may also be attained in where (1) a mechanism for rotating the pads 4, 5 is used or (2) a mechanism for rotating the processed wafer and a mechanism for rotating the pads are used together.

A cleaning procedure in accordance with the dry cleaning method of the present invention will now be described.

At first, the functions of the pads 4 and 5 will be described. The pads 4 and 5 mainly perform the cleaning and removal of particles adsorbed on the front surface or the rear surface of the processed wafer under application of a physical force. However, in the case of the surface of the processed wafer where an ultrafine semiconductor device is formed, if the pad 4 is directly contacted with the surface of the processed wafer, an excessive physical force results in damage to the surface of the processed wafer. Due to this fact, in the preferred embodiment, the structure is made such that gas is flowed between the pad 4 and the surface of the processed wafer 2 and a physical force indirectly acts on the surface of the processed wafer through the gas. The gas flow is generated between the pad 4 and the surface of the processed wafer 2 to enable a frictional stress of the gas flow to act against the surface of the processed wafer. Due to this fact, it is possible to generate a high moving force without contacting the surface of the wafer. In addition, it becomes possible to generate a high speed gas flow having an effective cleaning power over a wide range by feeding gas into a small clearance between the pad 4 and the surface of the processed wafer 2. Further, the cleaning power generated by this high gas flow speed is determined by the space of clearance and the gas flow rate, so that the cleaning power can be precisely controlled only through control of the pressing force acting between the pad 4 and the surface of the processed wafer 2 and the flow rate of the gas. Both a low damage characteristic and a high cleaning power can be attained by this precise cleaning power control function. In-addition, it becomes possible to have the cleaning power against all the portions of the surface of the processed wafer 2. Due to this fact, a high efficient physical cleaning power can be attained on an ultra fine semiconductor structure where the cleaning action with the surface tension is not provided by the wet cleaning action. In regard to the pad structure 5 for cleaning the rear surface of the processed wafer, this is basically the same as that of the surface cleaning, although it is not necessary to be concerned with any damage resulting from the pad being directly contacted with the rear surface of the processed wafer to clean it. Thus, a high particle removing capability can be realized.

Figure 8:
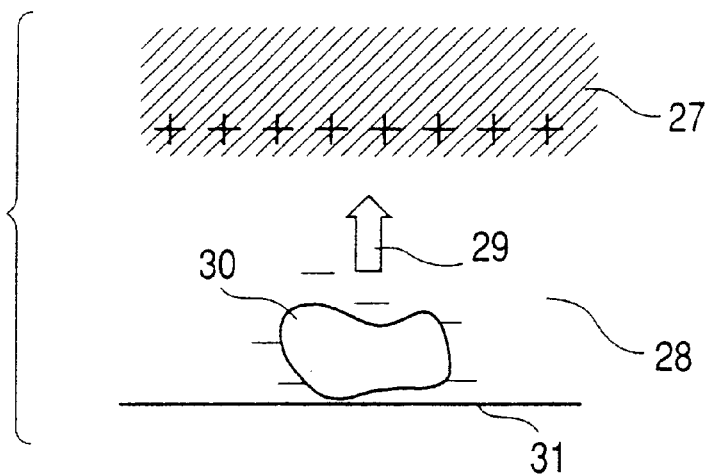
FIG. 8 is an illustrative view for showing one example of cleaning action with plasma.
Figure 9:
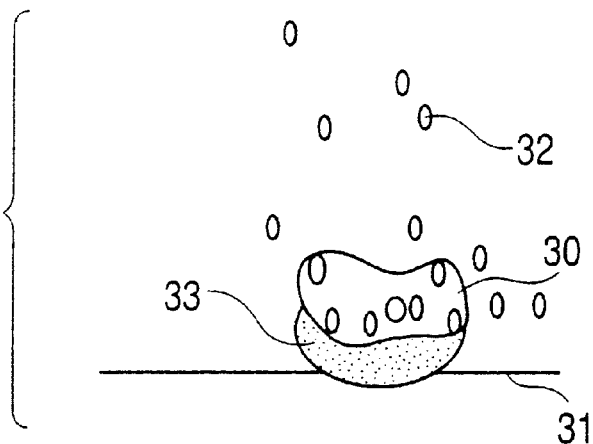
FIG. 9 is an illustrative view for showing another example of cleaning action with plasma.
Figure 10:
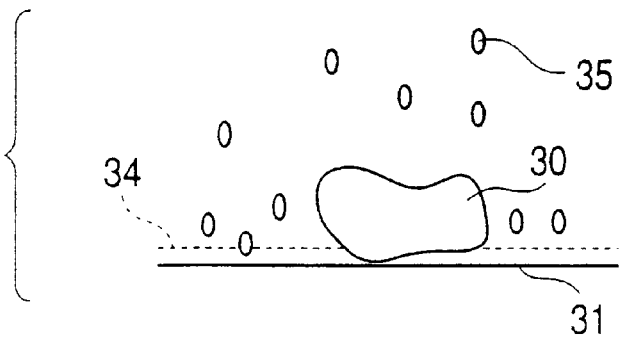
FIG. 10 is an illustrative view for showing a still further example of cleaning action with plasma.

Referring to FIGS. 8, 9 and 10, a function of the plasma generating means 9 will be described as follows.

The function of plasma shown in FIGS. 8, 9 and 10 consists in dampening an adsorbing force of some particles which are difficult to remove, only through the physical action attained by the pad 4 described above and improving the cleaning efficiency in that the cleaning action is assisted. At first, in FIG. 8 is shown a procedure for dampening the adsorbing power of particles 30 electrostatically with the plasma 27. The particles 30 which are negatively charged are electrostatically adsorbed at the surface 31 of the wafer after manufacturing of the semiconductor under application of plasma etching or sputtering process. However, an electrostatical suction force 29 against the particles 30 is generated in the ion sheath 28 by the plasma charge in the thin plasma generated by the plasma generating means 9 of the preferred embodiment and it is possible to increase (assist) the physical action cleaning power of the pads 4 or 5.

Then, in FIG. 9 is shown a procedure for dampening the adsorbing power when the particles 30 are chemically adsorbed at the surface 31 of the processed wafer. Normally, in the case that the particles 30 are chemically adsorbed at the surface 31 of the processed wafer, an oxidization reaction is generated at a contact surface between the particles 30 and the surface 31 of the processed wafer. That is, the chemical adsorbing power is generated through giving or receiving some electrons between the particles 30 and the surface 31 of the processed wafer. Under this state, the adsorbing power of the particles 30 is produced under giving or receiving of electrons between the particles 30 and the surface of the wafer through the chemical adsorbing layer 33 in a chemical reaction concept. In view of this fact, high oxidized active elements 32 such as ozone or oxygen radicals and the like are produced by generating plasma through supplying oxygen gas. By exchanging of electrons between the particles 30 and the active elements 32 the chemical adsorbing power of the particles can be dampened. Also, supplying these mixture gases of oxidization-reducing gas including nitrogen, hydrogen or oxygen in the plasma can attain a similar effect.

Further, a cleaning auxiliary action through lift-off function shown in FIG. 10 will be described.

In the preferred embodiment, $CF_4$ gas is supplied to the plasma generating means 9 in addition to Ar gas supplied from the pads 4, 5. This $CF_4$ gas is dissociated into high reactive halogen radicals 35 such as F, $CF_3$ through generation of the plasma. These halogen radicals 35 etch (lift off) a quite small amount of either silicon or silicon oxide film on the surface 31 of the processed wafer to cause the particles 30 melted into or in the surface 31 of the processed wafer to be easily removed and a physical cleaning power attained by the pad is increased. That is, the surface 34 of the wafer before cleaning operation is etched back to reduce a contact area of the particles 30 against the surface 31 of the wafer. Due to this fact, the particles 30 can be easily removed.

In the preferred embodiment, although the dissociated component of $CF_4$ gas has been applied, it is apparent that a similar lift-off effect can be attained even if dissociated substances such as $C_2F_6$, $C_3F_8$, $C_{12}$, $F_2$, $NF_3$, HF, ammonia and hydrogen gas and the like are applied. In addition, since the particles adsorbed to the surface of the processed wafer are adsorbed in various forms, it is apparent that each of the cleaning auxiliary actions described in reference to FIGS. 8, 9 and 10 is not applied independently but they act in their merged state to remove particles.

A high efficient cleaning of the wafer within the vacuum or atmosphere of lower pressure can be carried out under a combination of physical action by the pad, a chemical action with plasma and an electrical action.

In particular, the dry cleaning method of the present invention can realize a sufficient cleaning effect against the fine structure through application of it to the manufacturing of the semiconductor device having a small through-hole structure with an inner diameter being less than 0.3 μm. due to this fact, it becomes possible to manufacture a semiconductor device in a low cost and with a high yield.

In the aforesaid preferred embodiment, the physical cleaning action caused by the pads 4, 5 is assisted by the reaction of the plasma. In another preferred embodiment, an ultraviolet ray light source in place of the plasma generating means 9 is used. A similar chemical action can be attained even after exciting the reaction gas fed into the vacuum state by the ultraviolet ray and the physical cleaning action with the pads 4, 5 can be assisted.

Further, a lift-off function with respect to either silicon or silicon oxide film in the previous preferred embodiment can be realized by applying either fluoric acid vapor or mixture gas of fluoric acid and water vapor as another preferred embodiment in place of the production of plasma and the physical cleaning action of the pads 4, 5

Further, the assist to the particle removing action in the aforesaid preferred embodiment can be attained also under a combination of other optional particle removing means in addition to the combination with the particle removing means of the high-speed injection gas flow from the pads 4, 5 described above. For example, a combination with the particle removing means under utilization of high-speed gas flow attained by the high-speed discharging (an effective discharging speed: 800 liters/sec. or more) with the discharging means accompanied by the vacuum container 1, may be utilized.

In addition, a main process (an etching process for an oxidization film) and a cleaning process may be performed continuously within the vacuum container 1 (the processing chamber) in the manufacturing process for the semiconductor device using the dry cleaning apparatus shown in FIG. 1. At the main plane of wafer in a location where it is not covered by the pad, an etching operation and a cleaning operation may be carried out.

Preferred Embodiment 3

Then, there will be described a method for manufacturing a semiconductor device using the present invention.

Figure 11:
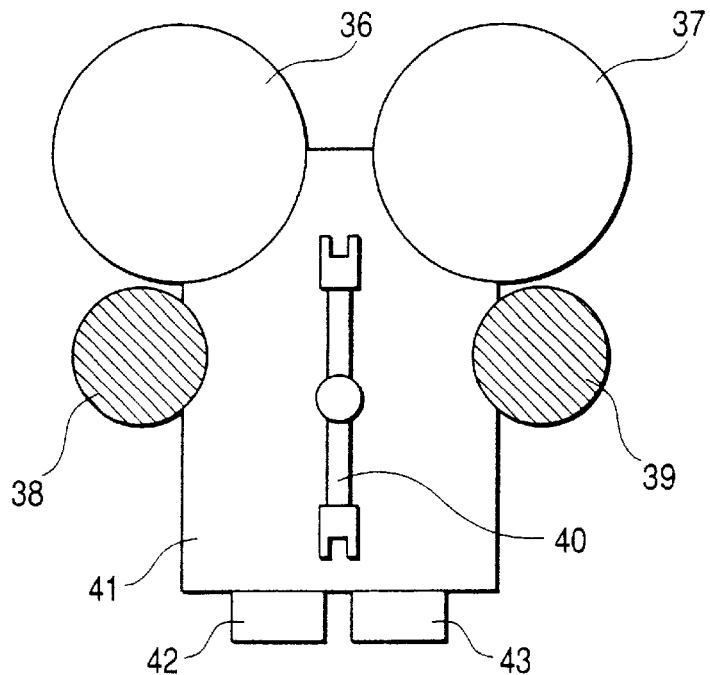
FIG. 11 is an illustrative view for showing one example of configuration of a semiconductor-manufacturing device in the preferred embodiment 3 of the present invention.

In FIG. 11 is shown an example of a configuration of the semiconductor device manufacturing apparatus in the case that a cleaning function of the present invention is added to either a dry etching or a plasma CVD or a sputtering device. Referring to FIG. 11, the method for manufacturing the semiconductor device will be described.

In the prior art, the wafer was once placed in the surrounding atmosphere after processing of the dry etching at the wafer and then the wet cleaning was carried out. The apparatus for manufacturing the semiconductor device shown in FIG. 11 is provided with cleaning chambers 38, 39 which are similar to that shown in FIG. 1, for example, In addition to the main process chambers 36, 37 such as etching chambers or the like. The wafer before processing is transferred from a wafer inlet cassette 42 into a wafer transferring chamber 41 by an arm 40. The wafer after the main processing and after the cleaning processing is transferred by the arm 40 into the wafer outlet cassette 43 and stored there.

In accordance with the preferred embodiment of the present invention, upon completion of the main process for the wafer (for example, a machining step for a wafer such as a dry etching and the like), the wafer is transferred into the cleaning chambers 38, 39 by the wafer transferring arm 40 within the wafer transferring chamber 41 without being exposed in the surrounding atmosphere and its cleaning processing is carried out. With such an arrangement as above, in view of the total processing step, it is possible to eliminate any surplus step accompanied by the wet cleaning operation and to reduce a manufacturing cost of the semiconductor device. In addition, since the wafer is totally processed within the vacuum atmosphere, a probability in which a surface quality at the wafer after processing is deteriorated is reduced, a device characteristic and a yield are improved and at the same time its throughput is also improved.

Figure 12:
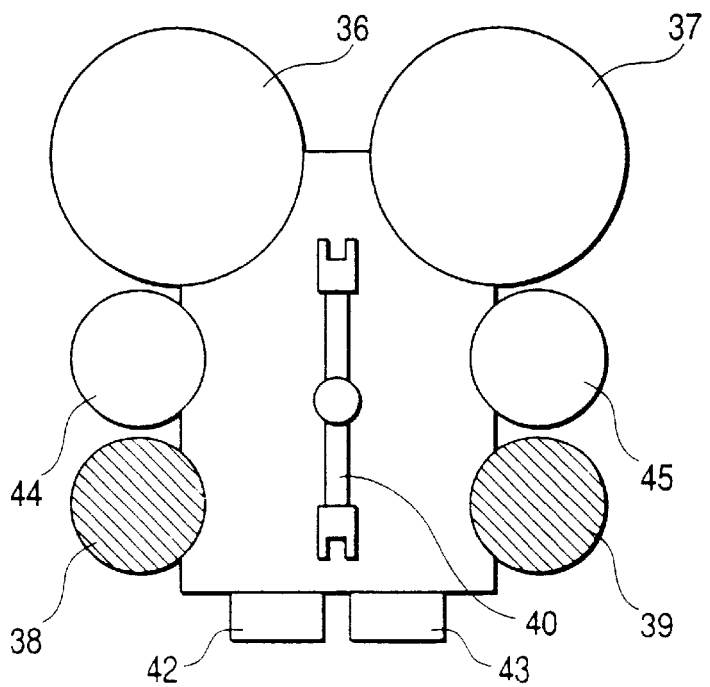
FIG. 12 is an illustrative view for showing another example of configuration of a semiconductor-manufacturing device in the preferred embodiment 3 of the present invention.

In FIG. 12 is shown an example of a modified application of the preferred embodiment shown in FIG. 11. This is an example in which the post-processing chambers 44, 45 are arranged in addition to the main processing chambers 36, 37. More practically, the main processing step is applied as an etching processing step and a post-processing step is applied as an ashing process for removing a resist-mask. That is, the ashing processing is carried out within the post-processing chambers 44, 45 after the etching processing is performed at the main processing chambers 36, 37. Then, further after this operation, the cleaning processing in the cleaning chambers 38, 39 is carried out. In this way, in the preferred embodiment, the main processing step, a post-processing step and a cleaning step in the present invention are totally performed in the vacuum. With such an arrangement as above, the wet cleaning step within the surrounding atmosphere after etching processing can be eliminated, a problem of degrading at the surface of the wafer that is inconvenient as described above can be avoided, cleaning and removal of the particles at the fine structural part can be carried out effectively, resulting in that both a precision in manufacturing after the manufacturing step and a yield of manufacturing can be improved.

In the preferred embodiment shown in FIGS. 11 and 12, the constitution of the device having each of the two main process chambers and post-processing chamber has been described above. Although this is an example in which the two chambers are applied to improve a mass production characteristic, it is apparent that even if a cleaning chamber of the present invention shown in FIG. 1 is added to the configuration of the device having each of one main processing chamber or post-processing chamber, a similar effect can be attained.

Figure 13:
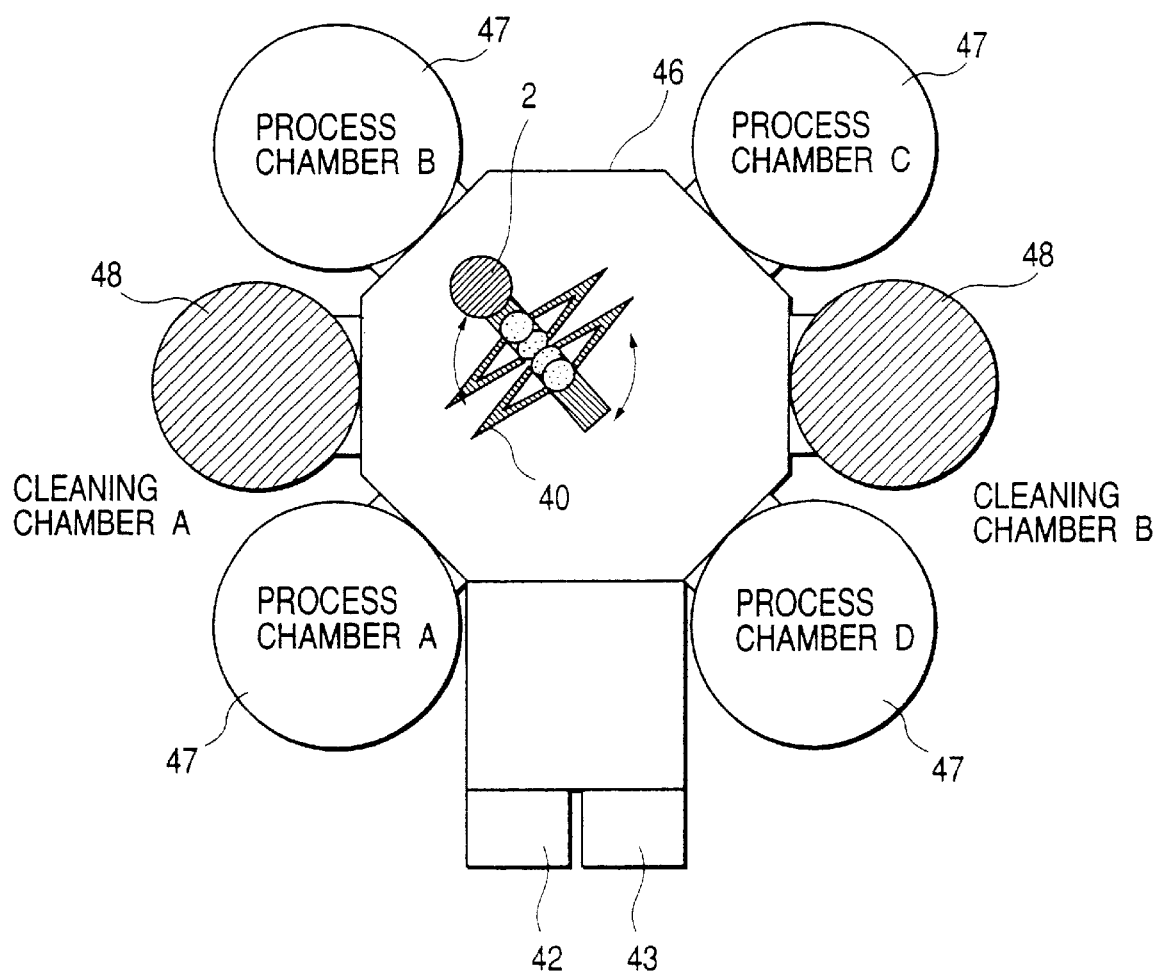
FIG. 13 is an illustrative view for showing a still further example of configuration of a semiconductor-manufacturing device in the preferred embodiment 3 of the present invention.

The apparatus for manufacturing a semiconductor device shown in FIG. 13 is operated such that not only the single processing within the vacuum as described above, but also a plurality of processings within the vacuum are totally carried out within the vacuum without exposing the wafer to the surrounding atmosphere even once during each of the processings. That is, a plurality of processing chambers 47 in this module are connected to and arranged in a multi-chamber type transferring chamber 46, and at least one or more of these plurality of processing chambers are constituted by the cleaning chamber 48 of the present invention as shown in FIG. 1.

In accordance with the preferred embodiment, a high efficient cleaning processing can be realized within the vacuum and it becomes possible to manufacture a low cost and higher performance semiconductor device.

Referring to FIGS. 14(a)–14(e), the process for manufacturing the semiconductor device through the manufacturing module shown in FIG. 13 will be described as follows.

FIGS. 14(a)-14(e) are a step diagram for showing a process in which a through-hole with a hole inner diameter less than 0.3 μm and an aspect ratio of 50 or more (a film thickness/a hole inner diameter) is formed at an oxidization film on the wafer. An oxidization film 100 is an inter-layer insulation film formed between an upper layer wiring and a lower layer wiring.

(a) A semiconductor substrate (wafer) having a polysilicon master 101 formed with a patterning on an oxidization film 100 is prepared. This polysilicon master 101 is made such that an opening 101a for use in forming the through-hole is formed with a patterning by a normal photo-lithography technology. Then, the wafer 2 is stored in a wafer inlet cassette 42 as shown in FIG. 13.

(b) Subsequently, the wafer 2 is transferred through a preliminary chamber into a multi-chamber type transferring chamber 46 shown in FIG. 13. Then, at first, the aforesaid wafer 2 is transferred by the wafer-transferring arm 40 into the processing chamber A. Within the processing chamber A, further polysilicon layer 102 is accumulated on the polysilicon mask 101 through the CVD process (FIG. 14(b)).

(c) The wafer 2, after passing through the aforesaid CVD process, is transferred into the cleaning chamber A and cleaned there. After this cleaning operation, the wafer 2 is transferred into the processing chamber B and the polysilicon layer 102 is left only on a sidewall of the opening part of the mask 101 through a dry etching (anisotropic etching) for the polysilicon layer 102. In accordance with this method, it is possible to form the opening 101b having a smaller inner diameter than the inner diameter of the opening 101a in self-alignment manner in respect to the opening 101a of the mask 101 (FIG. 14(c)).

(d) Subsequently, the aforesaid wafer 2 is transferred into the cleaning chamber B shown in FIG. 13, where the cleaning operation is carried out again. Then, the oxidization film 100 is processed with the dry etching within the processing chamber C to form the through-hole 100a in the oxidization film 100. This processing chamber C is constituted by the plasma processing device disclosed in Japanese Patent Laid-Open No. Hei 9-321031, for example (FIG. 14(d)).

(e) Upon forming of the through-hole through the aforesaid oxidization film etching process, some accumulated organic films during this oxidization film etching process are further processed with ashing process at the processing chamber D and removed from this chamber. The wafer after being processed with this ashing process is transferred into the wafer outlet cassette 43.

The aforesaid series of processes (a) to (e) enable at first the through-hole 100a having a smaller reduced inner diameter size than an inner diameter size of the opening 100a formed through patterning process at the polysilicon master 101 to be machined and formed within the oxidization film 100, resulting in that the machining with a machining size less than a limit value in a normal lithography technology.

Further, in accordance with the preferred embodiment of the present invention, the aforesaid series of processes that are carried out within the vacuum state under application of the manufacturing module of the present invention shown in FIG. 13 enable the manufacturing of the semiconductor device to be realized under a quite low cost as compared with that required in the wet cleaning process performed under the surrounding atmosphere in the prior art where it should be carried out during each of the processing steps.

Further, in accordance with the present preferred embodiment, some continuous processing steps including a CVD step, a polysilicon etching step, an oxidization film etching step and an ashing step are totally performed within the vacuum state, so that a cause reducing yield such as natural formation of oxidization film produced by its exposure in the surrounding atmosphere is eliminated and a machining size precision in forming the through hole is also improved.

Preferred Embodiment 4

Figure 15:
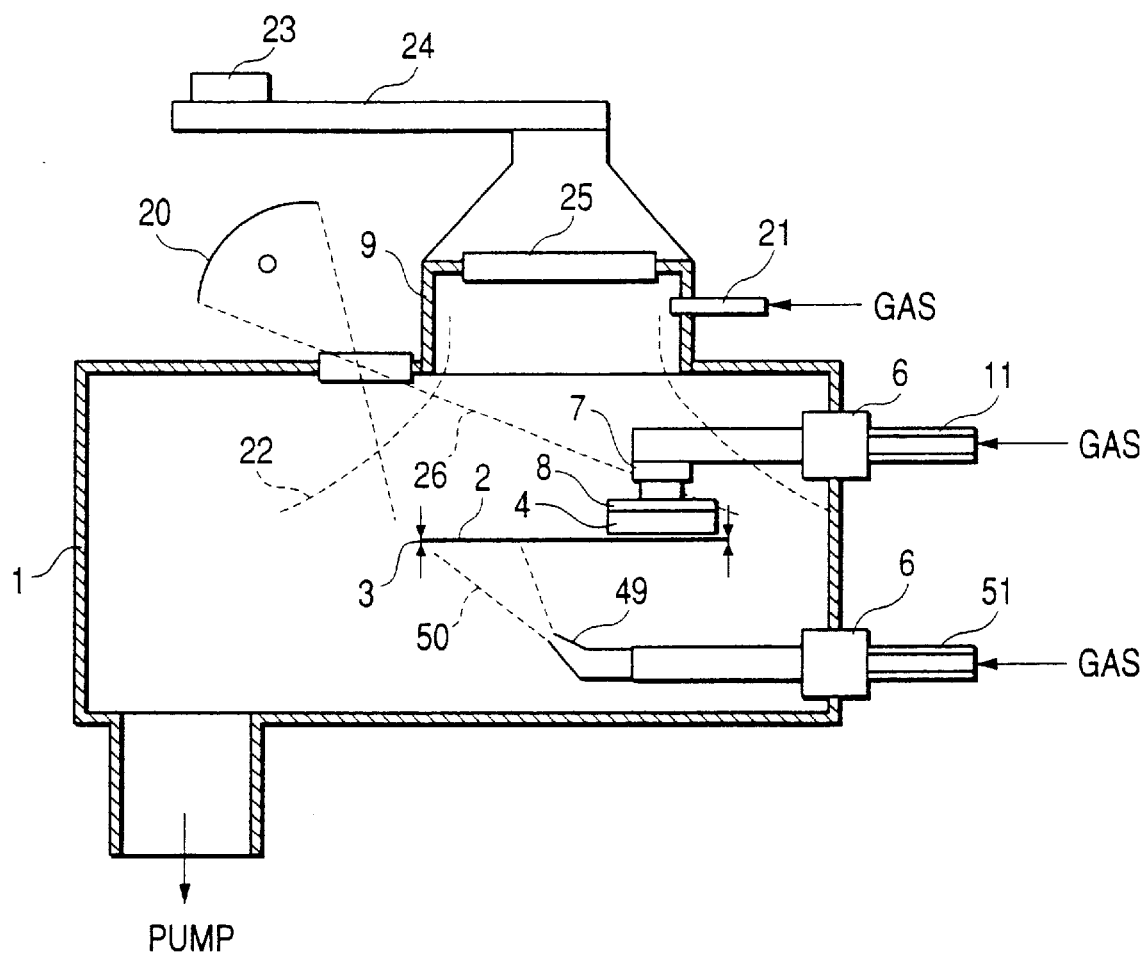
FIG. 15 is a view for showing a basic configuration of a dry cleaning apparatus in a preferred embodiment 4 of the present invention.

In FIG. 15 is illustrated an example of a configuration of the dry cleaning apparatus which is different from the preferred embodiments Nos. 1 and 2 shown in the previous FIG. 1 or FIG. 7. In the configuration of the device shown in FIG. 15, a cooling gas blowing means 49 is arranged in place of the previous pads for use in cleaning the rear surface of the processed wafer 2. When either carbonic acid gas or nitrogen gas is cooled, the cooling gas is fed into the vacuum container 1 through the gas feeding mechanism 51, and the gas is injected into the vacuum container 1 by the cooling gas blowing means 49 such as a fine nozzle and the like, some fine iced particles 50 are formed. The iced fine particles 50 have a relative high kinetic energy due to injection of the aforesaid gas and then the particles left on the rear surface of the processed wafer are struck and removed with this kinetic energy.

Referring now to FIG. 16(a)-FIG. 16(f), there will be described as follows a series of processing processes in this case of applying the cleaning method of the present invention to the MISFET forming process that is a basic portion of the semiconductor device made on the processed wafer.

Schematically shown in FIG. 16(a)-FIG. 16(f), the formation of MISFET is carried in sequence of (a) an element separation and polysilicon accumulation for a gate; (b) a gate electrode formation (polysilicon etching); (c) an extension (N-region) formation with ion implantation; (d) a nitrized film accumulation; (e) a gate electrode side wall protection film formation (a nitrized film etching); and (f) a silicide layer formation. A dry cleaning processing which is similar to that described in the previous preferred embodiment is carried out at each of the steps (a) to (f) described above.

Each of the steps (a) to (f) above will be described in brief as follows.

(a) at first, a groove separating region 54 for use in separating elements is formed at a silicon wafer 52. The silicon wafer 52 is a product where a P-well is formed at a P-type wafer. Subsequently, a gate polysilicon layer 53 is accumulated through a gate oxidization film (not shown). This gate polysilicon layer 53 is formed by a CVD method within a vacuum processing chamber (FIG. 16(a)).

Figure 16A:
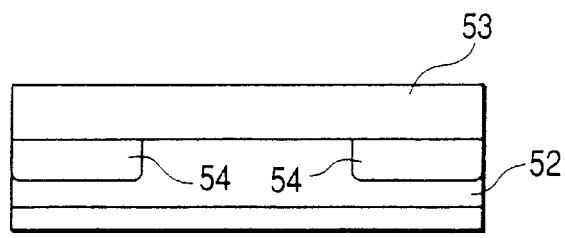
FIG. 16(a), FIG. 16(b), FIG. 16(c), FIG. 16(d), FIG. 16(e) and FIG. 16(f) are views for showing a manufacturing process for the semiconductor device in the preferred embodiment 4 of the present invention.
Figure 16B:
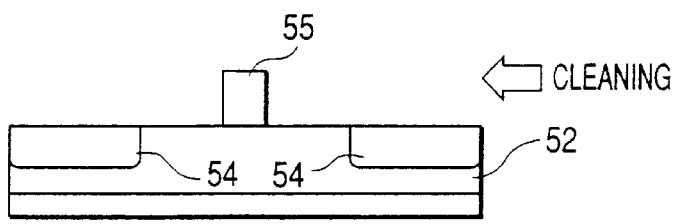
Figure 16C:
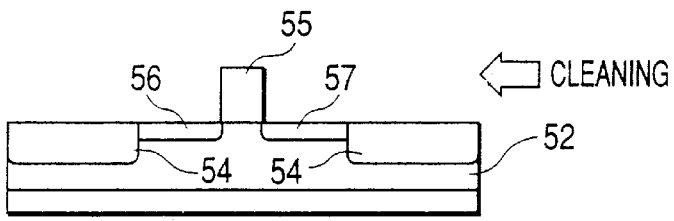

(b) A dry etching process for the polysilicon layer 53 is carried out within the vacuum processing chamber to form a gate electrode 55 (FIG. 16(b)).

(c) Extensions (N-region) 56, 57 aligned with the gate electrode 55 are formed by an ion implanting process. The extensions are of a source-drain region having a relative low concentration formed as a countermeasure against hot electron (FIG. 16(c)).

Figure 16D:
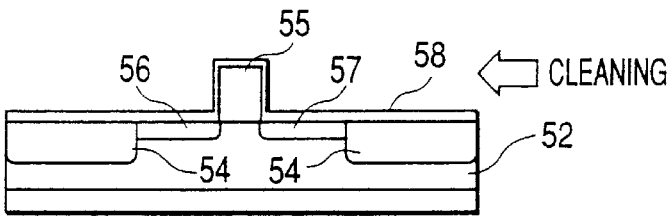
Figure 16E:
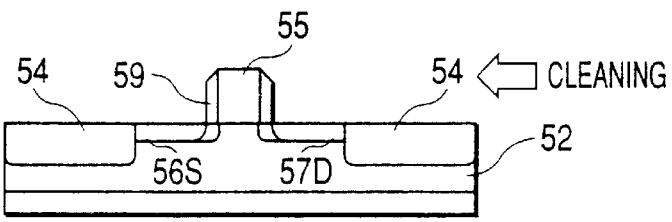
Figure 16F:
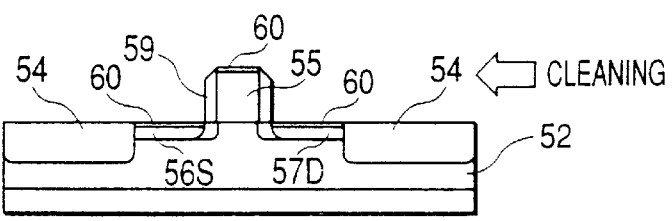

(d) A nitrized film 58 is accumulated by a plasma CVD method on the semiconductor wafer 52 having the gate electrode 55 (FIG. 16(d)).

(e) The nitrided film 58 is dry etched (anisotropic etching) to form the gate sidewall protection film 59 at the sidewall of the gate electrode 55. After this operation, the dry cleaning described in reference to the aforesaid preferred embodiment is performed. Further after this operation, N+regions (source, drain regions) 56S, 57D for contact having a relative high concentration aligned with the gate sidewall protection film 59 are formed by an ion implanting process (FIG. 16(e)).

(f) Subsequently, each of silicide layers 60 is formed at the surfaces of the source region 56S, drain region 57D and the surface of the gate electrode 55, respectively, to attain a low resistance. This silicide layer 60 is formed by a method wherein a cobalt layer, for example, is adhered to the surfaces of the source region 56S, the drain region 57D and the surface of the gate electrode 55 and they are processed with heat (FIG. 16(f)).

As described above, in accordance with the preferred embodiment of the present invention, since the cleaning processing at each of the steps in the MISFET forming process is carried out by a dry cleaning, it becomes possible to improve a yield in manufacturing and manufacture a high performance semiconductor device in a low cost.

In the present preferred embodiment, the manufacturing process for the semiconductor device has been described in reference to formation of MISFET. Practically, a plurality of such MISFETs as above are formed and semiconductor integrated circuit devices such a LSI, VLSI are constituted. Accordingly, some small structures with a size of 0.3 $\mu$m or less shown in FIGS. 17(a) and (b) are present at all locations on the wafer main plane. A cleaning effect at the wafer surface having such small structures as above will be described as follows.

Figure 17A:
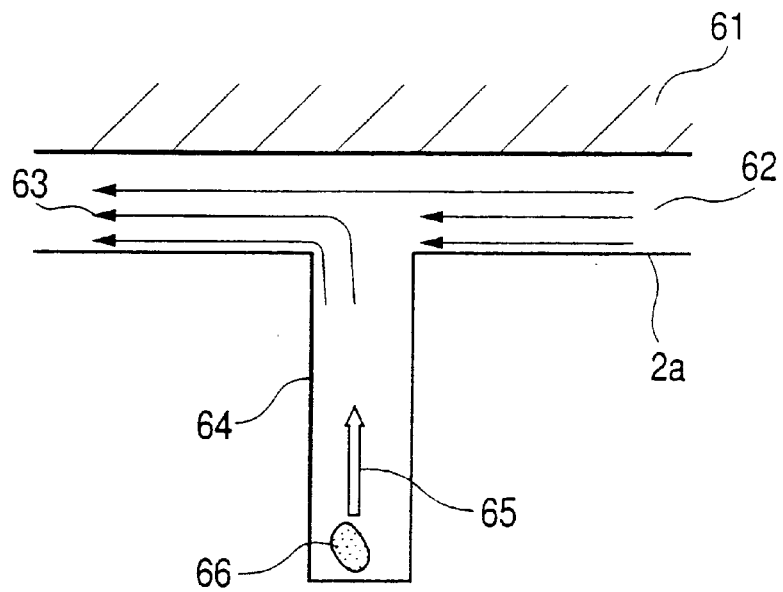
FIG. 17(a) and FIG. 17(b) are views for illustrating an effect of cleaning at a fine structural part under application of the dry cleaning method of the present invention.
Figure 17B:
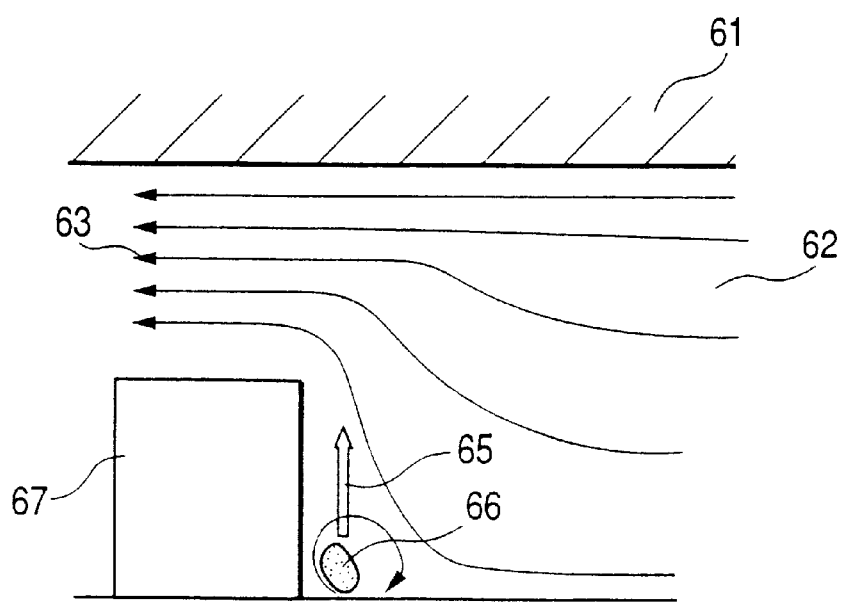

FIG. 17(a) is an illustration for showing a function to remove a particle 66 adhered to the inside part of a deep well contact 64. FIG. 17(b) is an illustration for showing a function to remove the particle 66 adhered to a corner part (a step part in the wiring) of a wiring 67.

As shown in FIG. 17(a) and FIG. 17(b), since a physical action for removing the particle 66 is generated by a viscous friction caused by a gas flow 63 at a clearance 62 between the pad 61 and the surface 2a of the wafer, a sufficient cleaning effect can be realized if the region is in a range where the gas flow reaches.

In the case of the prior art wet cleaning process, liquid is immersed little, if any, into the small structure due to surface tension of liquid. It thus may be assumed that a sufficient cleaning effect may not be attained at the small structure with a size of 0.3 $\mu$m or less. However, in the case of dry cleaning process of the present preferred embodiment, the gas flow having no such surface tension as above enables the problem of reducing cleaning power due to the aforesaid surface tension, to be avoided. Accordingly, the present invention can realize a substantial effect in the cleaning process for the semiconductor device of which small-size formation in the future is expected.

The cleaning method of the present invention is especially effective in the case of manufacturing LSI in which a memory LSI and a logic LSI are merged on a chip, for example, and an efficient cleaning process enables the system LSI to be manufactured within a short period of time, in a low cost and with a high yield.

Although the dry cleaning method and the preferable configuration of the device for carrying out the method of the present invention have been described more practically above in reference to various kinds of preferred embodiments, it is of course apparent that the present invention is not limited to these preferred embodiments and various modifications can be realized without departing from its scope.

In accordance with the present invention, it is possible to perform a cleaning of the processed wafer totally in the vacuum chamber and further it becomes possible to perform a simultaneous cleaning of both front surface and rear surface of the processed wafer. The applied range of the cleaning processing can be expanded and both improving of yield in manufacturing of the semiconductor device and low cost become possible.

What is claimed is:

1. A method of cleaning surfaces of a wafer, comprising the steps of:
   (a) transferring a wafer into a vacuum container evacuated by a vacuum evacuating means;
   (b) supporting a peripheral section of said wafer for rotational movement;
   (c) rotating said wafer in a circumferential direction;
   (d) positioning a pad adjacent each of a front surface and a rear surface of said wafer;
   (e) supplying a gas into a clearance between each of said pads and one of said front surface and said rear surface of said wafer through an opening formed in each of said pads;
   (f) moving said pads and said wafer relative to each other; and
   (g) controlling a gas flow speed in said clearances by adjusting the amount of clearance between each of said pads and one of said front surface and rear surface of said wafer.

2. A method of cleaning surfaces of a wafer according to claim 1 wherein a size of each of said pads is smaller than a diameter of said wafer.

3. A method of cleaning surfaces of a wafer according to claim 1 which further includes generating a plasma and introducing the plasma into said vacuum container whereby the plasma assists in the cleaning of said wafer.

4. A method of cleaning surfaces of a wafer according to claim 1, which further includes detecting pressures acting on said pads.

5. A method of cleaning surfaces of a wafer according to claim 1 wherein gas is supplied into said clearance between each of said pads and said wafer through a plurality of openings in one or both of said pads.

6. A method of cleaning surfaces of a wafer according to claim 4 wherein said pressures are detected by any one of a piezoelectric element, a spring, a resilient material, a strain gauge, a weight or a combination of these elements.

7. A method of cleaning surfaces of a wafer according to claim 1 wherein a relative motion between each of the pads arranged at the front surface and the rear surface and said wafer is effected by rotating said pads in a direction of a plane with respect to the plane of said wafer and by moving said pads over the plane of said wafer.

8. A method of cleaning surfaces of a wafer according to claim 1 wherein said pads are constituted of a material having a lower hardness than that of a material constituting the surfaces of said wafer.

9. A method of cleaning surfaces of a wafer according to claim 8 wherein said material of said pads is a polymer made from one of polytetrafluoroetylene, polyvinyl alcohol, polyvinyl chloride, polyester, silicon oxide, silicon and aluminum oxide.

10. A method of cleaning surfaces of a wafer according to claim 3 wherein said plasma is formed from one oxygen, nitrogen, hydrogen, NF3, NH3, HF, C2F6, C3F8, F2, C12, He, argon, neon and xenon or a mixture thereof.

11. A method of cleaning surfaces of a wafer according to claim 1 wherein as said gas supplied to said clearances, is any one of Ar, nitrogen, He, Ne.

12. A method of cleaning surfaces of a wafer according to claim 11 wherein an amount of said supplied gas is in a range of 0.5 liter/min. to 500 liters/fin.

13. A method of cleaning surfaces of a wafer according to claim 1 wherein a clearance between one pad and said front surface of said wafer is in a range of 1 μm to 100 μm and a clearance between the other pad and said rear surface of said wafer is in a range of 0 to 100 μm or less.

14. A method of cleaning surfaces of a wafer according to claim 1 wherein said wafer is heated to 300° C. or less.

15. A method of cleaning surfaces of a wafer according to claim 3 wherein said plasma is for formed by feeding an electromagnetic wave in a frequency range of any one of a microwave band, a UHF band and a radio frequency band through a dielectric window into said vacuum chamber.

16. A method of cleaning surfaces of a wafer according to claim 3 wherein said plasma is formed by applying a magnetic field to an electromagnetic wave.

17. A method of cleaning surfaces of a wafer according to claim 3 wherein each of said pads is arranged in a diffusion region of said plasma.

18. A method of cleaning surfaces of a wafer according to claim 1 wherein the surface of said pad for cleaning the rear surface of said wafer is comprised of a plurality of protrusions or brush-like bristles, and ends of said protrusions or brush-like bristles contact the rear surface of said wafer.

* * * * *